United States Patent
Mitsuhiro et al.

(10) Patent No.: US 6,281,427 B1
(45) Date of Patent: Aug. 28, 2001

(54) SUBSTRATE FOR PRODUCING SEMICONDUCTOR DEVICE, METHOD FOR PRODUCING THE SUBSTRATE, PHOTOELECTRIC CONVERSION DEVICE AND METHOD FOR PRODUCING THE PHOTOELECTRIC CONVERSION DEVICE

(75) Inventors: Maruyama Mitsuhiro; Maruyama Yasuhiro, both of Tokyo (JP)

(73) Assignee: Digital Wave Inc., Tokyo (JP)

(*) Notice: Subject to any disclaimer, the term of this patent is extended or adjusted under 35 U.S.C. 154(b) by 0 days.

(21) Appl. No.: 09/391,414

(22) Filed: Sep. 8, 1999

(30) Foreign Application Priority Data

Sep. 8, 1998 (JP) .................................................. 10-253930

(51) Int. Cl.$^7$ ............................. H01L 31/04; H01L 27/14
(52) U.S. Cl. ...................... 136/250; 136/252; 136/255; 136/256; 136/261; 257/428; 257/431; 257/461; 257/459; 438/57; 438/63; 438/89
(58) Field of Search ............................. 136/250, 252, 136/255, 256, 261; 257/428, 431, 461, 459; 438/57, 63, 89

(56) References Cited

U.S. PATENT DOCUMENTS

| | | | |
|---|---|---|---|
| 4,107,724 | * 8/1978 | Ralph | 136/250 |
| 4,390,743 | * 6/1983 | Dahlberg | 136/258 |
| 4,514,580 | * 4/1985 | Bartlett | 136/250 |
| 6,204,545 | * 3/2001 | Nakata | 257/459 |

FOREIGN PATENT DOCUMENTS

2326156 * 12/1974 (DE).

* cited by examiner

*Primary Examiner*—Alan Diamond
(74) *Attorney, Agent, or Firm*—Crowell & Moring, L.L.P.

(57) ABSTRACT

A semiconductor-device-producing substrate and method for producing the substrate which is inexpensive and good in quality and which has a large-area surface layer. A photoelectric conversion device and method uses the semiconductor-device-producing substrate, with high efficiency being obtained by means of the large-area light-receiving surface and three-dimensional structure of the photoelectric conversion device. Semiconductor granular crystals are arranged in at least one layer on a semiconductor substrate and connected and fixed to one another by heating or by a chemical vapor-phase deposition method to thereby form a semiconductor-device-producing substrate. An active layer of one conduction type is formed on the substrate and then another active layer of the other conduction type is formed on the surface of the first-mentioned active layer by a chemical vapor-phase deposition method or by a diffusion method to thereby form a PN junction surface having a three-dimensional structure. As a result, a solar cell or a light-emitting diode high in efficiency can be obtained.

3 Claims, 3 Drawing Sheets

SUBSTRATE FOR PRODUCING SEMICONDUCTOR DEVICE, METHOD FOR PRODUCING THE SUBSTRATE, PHOTOELECTRIC CONVERSION DEVICE AND METHOD FOR PRODUCING THE PHOTOELECTRIC CONVERSION DEVICE

BACKGROUND OF THE INVENTION

The present invention relates to a substrate used for producing a semiconductor device, a method for producing the substrate, a photoelectric conversion device and a method for producing the photoelectric conversion device. Particularly, the present invention relates to a semiconductor-device-producing substrate in which substantially spherical granular crystals are arranged in the form of a plurality of layers on a substrate and in which the granular crystals are mechanically and electrically connected to one another and the granular crystals abutting on the substrate are mechanically and electrically connected to the substrate to form a PN junction on the granular crystals to thereby provide large-area active layers and such a substrate, further relates to a method for producing such a substrate, a photoelectric conversion device using such a substrate, and a method for producing such a photoelectric conversion device.

In recent years, semiconductor wafers, especially silicon or compound semiconductor wafers are used popularly for producing semiconductor devices such as a solar cell, a rectifier, a light-emitting diode, a transistor, an integrated circuit, etc.

Semiconductor substrate crystal wafers having accurately mirror-polished surfaces are mainly used for production of these semiconductor devices. Ensuring of materials and extreme reduction in cost have become more important with the improvement of the quality of substrate materials and mass production because of the advance of high-density integration of semiconductor devices and the increase in size of substrate crystals.

The related art will be described below about production of a solar cell (photoelectric conversion device) using silicon by way of example.

Several methods have been used in the related art for production of a solar cell. As examples of the method using a flat substrate, in the related art, there are known: (1) a method in which a PN junction is formed on a surface of a flat silicon monocrystal or polycrystal by a diffusion method or a chemical vapor deposition (CVD) method; (2) a method in which P type and N type amorphous silicon layers are laminated on a flat metal plate to thereby form a PN junction; (3) a method in which a laminate structure having two layers of PN junctions series-connected through a tunnel junction is formed on a flat substrate (Appl. Phys. Lett. 65 (8) Aug. 22, 1994, p989); etc.

As examples of the method using granular crystals, there are known: (4) a method in which P type spherical grains each having a PN junction surface are inserted one by one into holes formed in aluminum foil having opposite surfaces coated with a polymer material to thereby connect electrodes of an N type portion of the surface and then a part of the N type layer of the spherical grains is removed to take out the electrodes from a P type portion of this part to thereby form a spherical grain array having a PN junction (JP-A-58-54684); (5) a method in which a plurality of P type granular silicon crystals are arranged on an aluminum thin film on the substrate, the whole surface of the aluminum thin film is coated with silicon dioxide by CVD, silicon dioxide films on the surfaces of the granular crystals are removed selectively, and n-type impurities are added to the surfaces of the granular crystals or Schottky barriers of tin oxide film are formed to thereby form a solar cell (JP-A-51-27077 and JP-A-51-129192); etc.

FIGS. 5A to 5D are views for explaining a method for producing a photoelectric conversion device (solar cell) in the related art. A technique of the related art will be described below with reference to FIGS. 5A to 5D. That is, FIGS. 5A to 5D show an example of the method (5) using granular crystals. In FIGS. 5A to 5D, the reference numeral 11 designates silicon fine crystals; 12, a substrate; 13, an aluminum thin film layer; 14, an alumina thin film; 15, a silica ($SiO_2$) thin film; 16, a surface electrode; and 17 and 17', lead wires.

First, as shown in FIG. 5A, silicon fine crystals 11 formed from silane halide by vapor-phase fluidization are deposited on an aluminum thin film layer 13 formed on a metal or ceramic substrate 12. Then, the resulting substrate is heated at a temperature near the eutectic point 575° C. of aluminum and silicon, so that the silicon fine crystals 11 are fixed to the aluminum thin film layer 13. Further, the resulting substrate is oxidized so that alumina thin films 14 are formed on the aluminum thin film layer 13 and silica thin films 15 are formed on the silicon fine crystals 11 as shown in FIG. 5B.

Then, the silica thin films 15 on the silicon fine crystals are selectively removed with a hydrofluoric acid so that the silicon fine crystals 11 are exposed as shown in FIG. 5C. N type impurities are introduced in the silicon fine crystals 11 through the exposed surfaces of the silicon fine crystals 11 to provide a thin-film metal electrode as a surface electrode 16 or provide a transparent electrode of tin oxide, or the like, and form Schottky junctions between the electrode 16 and the silicon fine crystals 11. The lead wires 17 and 17' are led out from the surface electrode 16 and the aluminum thin film 13 respectively. In the aforementioned manner, a solar cell is produced.

In the related-art methods (1) and (2) using a flat substrate, silicon monocrystal, silicon polycrystal or amorphous is used as a material. The photoelectric conversion efficiency per unit area of the substrate is in a range of from about 7% to about 15%. Further, semiconductor-grade high purity crystal is used as a substrate material. Accordingly, there arises a problem that it is difficult not only to reduce the cost but also to secure a large quantity of material. In the related-art method (3) in which a laminate structure having two layers' PN junctions series-connected through a tunnel junction is formed on a flat substrate, the photoelectric conversion efficiency exceeds 20% but the producing method is complex. Accordingly, there arises a problem that it is difficult to perform mass production and to reduce the cost.

In the related-art method (4) using granular crystals, not only photoelectric conversion is performed only by single sides of granular balls inserted in holes of the aluminum foil plate but also the distance between adjacent granular balls is large. Accordingly, there arises a problem that the conversion efficiency per unit area is low to be in a range of from 8% to 10%. In the related-art method (5), the lower surfaces of the silicone fine crystals arranged on the aluminum thin film are alloyed with aluminum to serve as an electrode, so that photoelectric conversion is performed only by the residual surface layer. Accordingly, in the related-art technique, the PN junction area per unit area of the substrate for performing photoelectric conversion is no more than twice the substrate area. Furthermore, the surfaces of the silicon fine crystals obtained by granulation in a vapor-phase reaction of a silane group are rough and the fine crystals contain hydrogen or chlorine gas and have high specific resistance (not smaller than 100 Ω·cm). Accordingly, there arises a problem that sufficient photoelectric conversion property cannot be obtained.

SUMMARY OF THE INVENTION

It is an object of the present invention to solve the aforementioned problems in the related art.

It is another object of the present invention to provide a semiconductor device-producing substrate inexpensive and good in quality and having a large-area surface layer.

It is a further object of the present invention to provide a method for producing such a semiconductor-device-producing substrate.

It is a still further object of the present invention to provide a photoelectric conversion device such as a solar cell, or the like, in which high efficiency can be obtained on the basis of a light containment effect due to the large-area light-receiving surface and three-dimensional structure thereof by use of a semiconductor-device-producing substrate produced by the aforementioned substrate producing method.

It is another object of the present invention to provide a method for producing such a photoelectric conversion device.

It is a further object of the present invention to provide a photoelectric conversion device such as a light-emitting diode, or the like, having a high-luminance light-emitting surface on the basis of a radiated-light integrating effect due to the large-area light-emitting surface and three-dimensional structure thereof by use of a semiconductor-device-producing substrate produced by the aforementioned substrate producing method.

It is a still further object of the present invention to provide a method for producing such a photoelectric conversion device.

In order to achieve the above objects, according to an aspect of the present invention, provided is a semiconductor-device-producing substrate having a three-dimensional structure in which semiconductor granular crystals or semiconductor-coated granular crystals are arranged in at least one layer on a semiconductor substrate or a semiconductor-coated substrate having a flat or uneven surface, the granular crystals being connected and fixed to one another and to the substrate through semiconductor film.

According to another aspect of the present invention, provided is a semiconductor-device-producing substrate having a three-dimensional structure in which semiconductor granular crystals or semiconductor-coated granular crystals are arranged in a plurality of layers, the granular crystals being connected and fixed to one another through semiconductor film.

According to the present invention, active layers having a PN junction surface are formed on surfaces of granular crystals on the semiconductor-device-producing substrate. Accordingly, there can be provided a photoelectric conversion device in which the PN junction surface serves as a solar cell for performing opto-electric conversion or as a light-emitting diode for performing electro-optical conversion.

According to a further aspect of the present invention, provided is a method for producing a semiconductor-device-producing substrate, comprising the steps of: arranging semiconductor granular crystals or semiconductor-coated granular crystals in at least one layer on a semiconductor substrate or a semiconductor-coated substrate having a flat or uneven surface; and connecting and fixing the granular crystals to one another and to the substrate through semiconductor film by heating or semiconductor film-bonding by a CVD method.

According to a still further aspect of the present invention, provided is a method for producing a semiconductor-device-producing substrate, comprising the steps of: arranging semiconductor granular crystals or semiconductor-coated granular crystals in at least one layer on a substrate; and connecting and fixing the granular crystals three-dimensionally to one another and to the substrate by semiconductor film by heating or semiconductor film-bonding by a CVD method.

In the photoelectric conversion device configured as described above according to the present invention, a semiconductor-device-producing substrate composed of a semiconductor substrate, and semiconductor granular crystals arranged in the form of a plurality of layers on the semiconductor substrate is used so that a PN junction surface is formed on a surface of the substrate. Accordingly, the area of the effective PN junction surface formed on surfaces of the granular crystals can be increased to be in a range of from about four times to about ten and several times the area of the substrate. When, for example, the photoelectric conversion device is configured as a solar cell, input light (solar light) from upper portions and side portions of the granular crystals and spaces between the granular crystals is introduced into the surfaces of the inner granular crystal layers and the surface of the substrate so that excitation and reflection of electrons on the whole surface of the granular crystals are repeated. As a result, the input light is thoroughly enclosed in the granular crystal layers (light containment effect), so that the energy of the input light is converted into electric power effectively. Accordingly, the photoelectric conversion efficiency can be improved greatly.

Generally, a solar cell produced by a related-art technique is not utilized effectively though the solar cell has high energy, because the short-wave side of visible light rays has a tendency to be reflected (lost) on the surface of the solar cell. On the contrary, in the solar cell according to the present invention, a substrate having a structure in which granular crystals are formed in the form of a plurality of layers on a substrate crystal is used so that not only a large-area PN junction surface formed on the surface of the substrate can take in even the short-wave side of visible light rays effectively but also the photoelectric conversion efficiency of the solar cell can be improved greatly on the basis of a light containment effect due to the three-dimensional structure of the substrate.

Further, in the light-emitting diode according to the present invention, a semiconductor-device-producing substrate having compound semiconductor granular crystals arranged as a plurality of layers on a compound semiconductor substrate is used so that a PN junction surface is formed on the surface of the substrate. When a forward current is made to flow in the PN junction, photoelectric conversion occurs in the PN junction surface of the light-emitting diode, so that light of a wavelength corresponding to the forbidden band width of the semiconductor is radiated. In the light-emitting diode, the area of the PN junction formed on surfaces of the granular crystals on the flat surface of the substrate and serving as a light-emitting surface can be formed to be in a range of from several times to ten and several times the area of the substrate. Further, light generated in the surface active region of the substrate and granular crystals is made to pass through the active layers without absorption to the active layer region, so that the light is repeatedly reflected on the substrate (Si, GaAs, etc.) surface and granular crystal surfaces just under the active layers. Accordingly, the quantity of light is integrated during the repeated reflection, so that the integrated light is radiated toward the outside (vertically) or toward end surfaces of the granular crystal layers (horizontally) from the surfaces of the granular crystal layers via spaces formed between the granular crystals. As a result, in the light-emitting diode according to the present invention, the quantity of light emitted from the junction surface is integrated (integrating effect) and luminance per unit area is enhanced greatly, so that high-luminance large-area light emission can be obtained.

DESCRIPTION OF THE PREFERRED EMBODIMENTS

Embodiments of the present invention as to a substrate for producing a semiconductor device, a method for producing the substrate, a photoelectric conversion device and a method for producing the photoelectric conversion device will be described below in detail with reference to the drawings.

Figure 1:
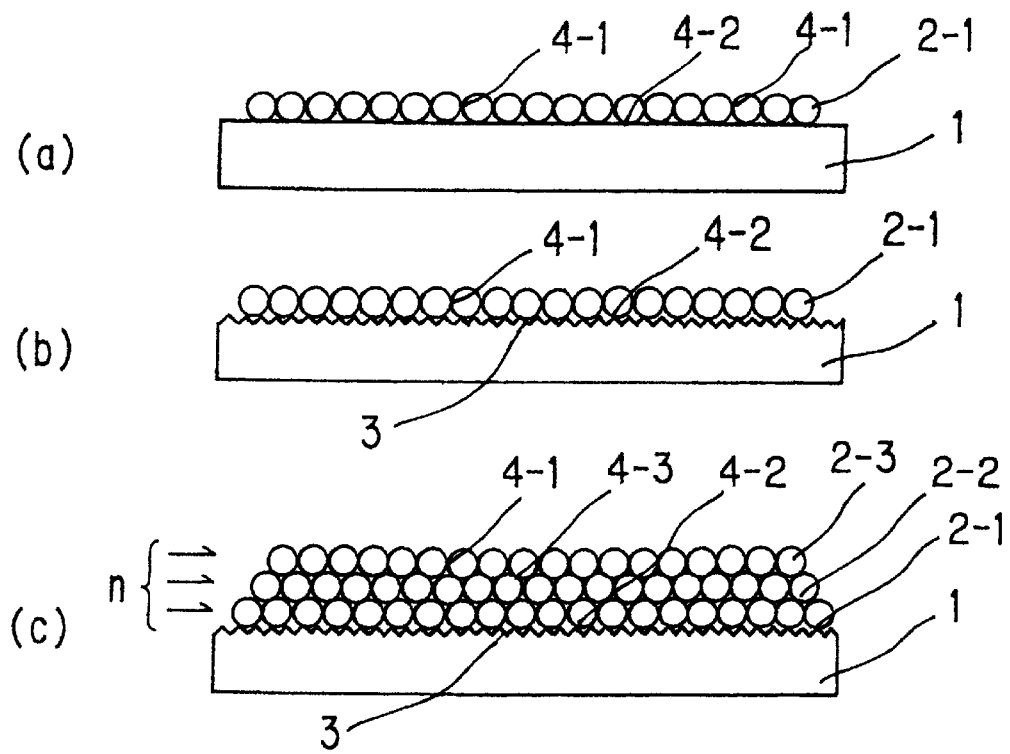
FIGS. 1A to 1C are views for explaining the structure of a substrate for producing a semiconductor device and a method for producing the substrate according to an embodiment of the present invention.
Figure 2:
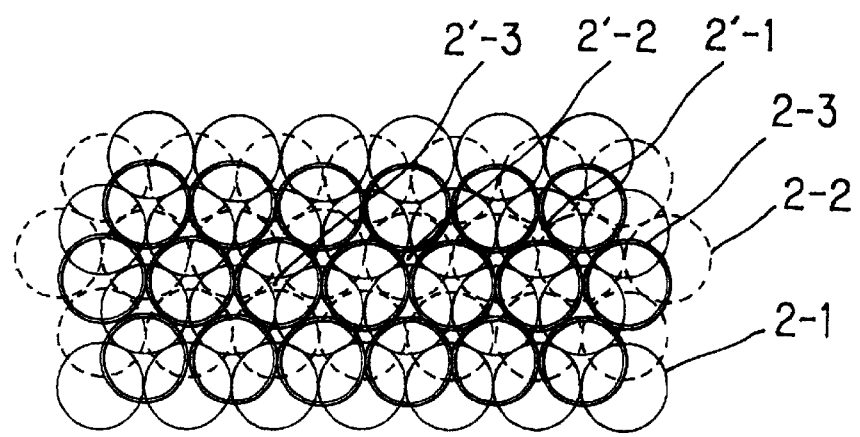
FIG. 2 is a top view of the substrate depicted in FIG. 1c, showing an example of the arrangement (densest packing of three layers) of semiconductor granular crystals.

FIGS. 1A to 1C are views for explaining the structure of a substrate for producing a semiconductor device and a method for producing the substrate according to an embodiment of the present invention, and FIG. 2 is a top view of the substrate depicted in FIG. 1C, showing an example of the arrangement (densest packing of three layers) of semiconductor granular crystals. In FIGS. 1A to 1C and FIG. 2, the reference numeral 1 designates a semiconductor substrate; 2-1 to 2-3, first, second and third semiconductor granular crystal (silicon fine crystal) layers; 3, an uneven surface of the semiconductor substrate; 4-1, connection points each formed between adjacent semiconductor granular crystals contained in one and the same layer; 4-2, connection points each formed between the surface of the semiconductor substrate and a semiconductor granular crystal; 4-3, connection points each formed between semiconductor granular crystals contained in adjacent upper and lower layers respectively; and 2'-1 to 2'-3, common spaces each formed between adjacent layers.

In the embodiment of the present invention shown in FIGS. 1A to 1c and FIG. 2, there are shown the structure of a semiconductor-device-producing substrate used for producing a photoelectric conversion device such as a solar cell, a light-emitting diode, or the like, by use of a plurality of semiconductor granular crystal layers and a semiconductor substrate having a flat or uneven surface, and a method for producing the substrate. This embodiment will be described below.

FIGS. 1A to 1C show the sectional structure of the arrangement of semiconductor granular crystal layers and a semiconductor substrate forming PN junction areas along a surface of the semiconductor substrate. In the structure shown in FIG. 1A, there is shown the case where semiconductor granular crystals 2-1 are arranged in one layer on a flat surface of a semiconductor substrate 1. That is, the semiconductor granular crystals 2-1 are connected at connection points 4-1 each formed between adjacent semiconductor granular crystals 2-1 and at connection points 4-2 each formed between the surface of the semiconductor substrate and each semiconductor granular crystal 2-1 contained in the semiconductor granular crystal layer arranged on the semiconductor substrate 1.

In the structure shown in FIG. 1B, there is shown the case where semiconductor granular crystals 2-1 are arranged in one layer on an uneven surface 3 of a semiconductor substrate 1. That is, the semiconductor granular crystals 2-1 are connected at connection points 4-1 each formed between adjacent semiconductor granular crystals 2-1 and at connection points 4-2 each formed between the uneven surface 3 of the semiconductor substrate 1 and each semiconductor granular crystal 2-1 contained in the semiconductor granular crystal layer arranged on the semiconductor substrate 1.

In the structure shown in FIG. 1C, there is shown the case where semiconductor granular crystals are arranged in n layers on an uneven surface 3 of a semiconductor substrate 1. Specifically, the structure shown in FIG. 1C has three semiconductor granular crystal layers, that is, semiconductor granular crystals 2-1 arranged in a first layer, semiconductor granular crystals 2-2 arranged in a second layer and semiconductor granular crystals 2-3 arranged in a third layer, on the uneven surface 3 of the semiconductor substrate 1. The semiconductor granular crystals contained in the respective layers are connected at connection points 4-1 each formed between adjacent semiconductor granular crystals contained in one and the same layer, at connection points 4-2 each formed between the uneven surface 3 of the semiconductor substrate 1 and each semiconductor granular crystal 2-1 contained in the first layer, and at connection points 4-3 each formed between semiconductor granular crystals contained in adjacent two (upper and lower) layers respectively.

In FIG. 2 which is a top view of the substrate depicted in FIG. 1C and which shows an example of the arrangement (densest packing of three layers) of semiconductor granular crystals, semiconductor granular crystals 2-1 contained in the first layer, semiconductor granular crystals 2-2 contained in the second layer and semiconductor granular crystals 2-3 contained in the third layer are expressed by solid-line circles, broken-line circles and thick-solid-line circles respectively. Common spaces 2'-1 are formed between semiconductor granular crystals 2-3 contained in the third layer (surface layer) and semiconductor granular crystals 2-2 contained in the second layer so that surfaces of semiconductor granular crystals 2-1 contained in the first layer are exposed as light-receiving surfaces. Further, common spaces 2'-2 are formed between semiconductor granular crystals 2-3 contained in the third layer so that surfaces of semiconductor granular crystals 2-2 contained in the second layer are exposed as light-receiving surfaces. Further, common spaces 2'-3 located in the back of semiconductor granular crystals 2-3 contained in the third layer are formed between crystal granular crystals 2-1 and 2-2 contained in the first and second layers respectively so that the surface of the semiconductor substrate 1 is exposed as a light-receiving surface.

After the arrangement of semiconductor granular crystals in the form of a plurality of layers as described above, connection between adjacent semiconductor granular crystals and connection between the semiconductor substrate and each semiconductor granular crystal can be made by heating or by film bonding in accordance with a CVD method. As a result, the semiconductor granular crystals can be firmly connected and fixed to one another and to the semiconductor substrate.

In the structure shown in FIGS. 1C and 2, input light from the whole surface containing side surfaces of semiconductor granular crystals 2-3 contained in the third layer (surface layer) goes to semiconductor granular crystals 2-2 contained in the second layer. The light reflected from the semiconductor granular crystals 2-2 in the second layer passes through spaces 2'-3 located in the back surfaces of semiconductor granular crystals 2-3 contained in the third layer and reaches the semiconductor granular crystals 2-1 contained in the first layer and the surface of the semiconductor substrate 1. That is, the input light passes through spaces between the granular crystals from the granular crystals 2-3 contained in the third layer (surface layer) and is repeatedly reflected on the granular crystals contained in the respective granular crystal layers, so that the light is introduced into the inside of the granular crystal layers. Photoelectric conversion is performed on the PN junction surface formed on the reflection surface. The reflected light goes to the inside while being further repeatedly reflected, so that photoelectric excitation can be performed effectively on the whole surface of the granular crystals contained in the respective layers and on the surface of the semiconductor substrate. That is, when a photoelectric conversion device is formed by use of the semiconductor-device-producing substrate having the aforementioned structure, the photoelectric conversion efficiency can be enhanced greatly on the basis of an input light containment effect.

Referring to FIGS. 1C and 2, the area ratios among the surfaces of the semiconductor granular crystals, the surface of the uneven semiconductor substrate and the flat semiconductor substrate forming a PN junction surface used in the present invention will be described below.

The ratio (S.R.) of the effective PN junction area in the structure in which semiconductor granular crystals each having a PN junction formed on its surface are arranged on a plane of a unit area to the unit area of a PN junction formed on a plane of the semiconductor substrate can be calculated by the following expression:

$$S.R. \approx \{4\pi R^2 \times n + (2R)^2 \times m\} \div (2R)^2 \quad (1)$$

$$\approx \pi n + m$$

in which R is the radius of each granular crystal; $4\pi R^2$, the surface area of each granular crystal; $(2R)^2$, the square area; n, the number of granular crystal layers; and m, is an area factor due to the unevenness of the substrate surface.

According to the expression (1), S.R. takes a value of 4.1 in the case of n=1, a value of 10.4 in the case of n=3, and a value of 16.7 in the case of n=5. Although the above description has been made upon the assumption of m=1, the value of m is in a range of from 1.3 to 1.7 when the substrate surface is etched with alkali. Further, in the case of densest packing of granular crystals, the value of S.R. becomes larger. That is, according to the present invention, the effective PN junction area formed on the unit area of the flat substrate can be increased to be in a range of from several times to ten and several times.

Figure 3:
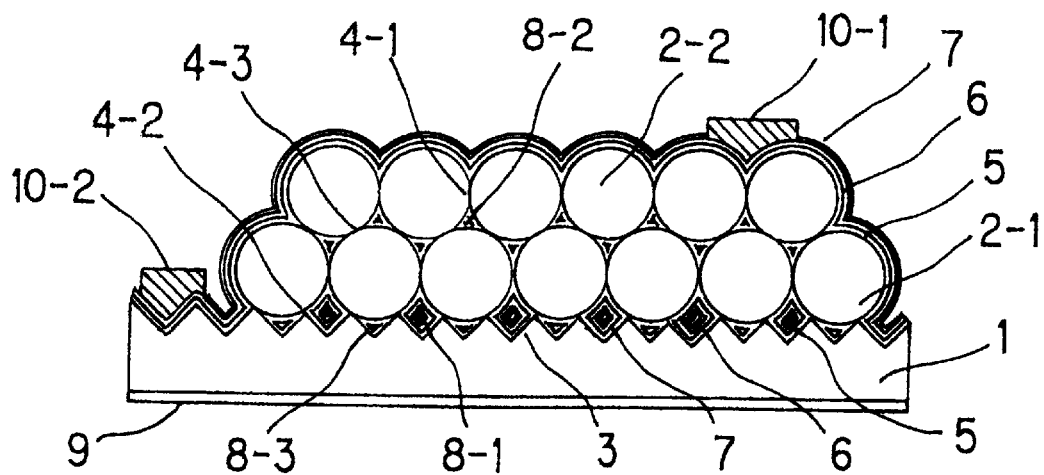
FIG. 3 is a view showing the sectional structure of a photoelectric conversion device according to an embodiment of the present invention, which is formed by use of a semiconductor-device-producing substrate comprising a semiconductor substrate and two semiconductor granular crystal layers.

FIG. 3 is a view showing the sectional structure of a photoelectric conversion device according to an embodiment of the present invention, which is formed by use of the aforementioned semiconductor-device-producing substrate composed of a semiconductor substrate and two semiconductor granular crystal layers. The photoelectric conversion device shown in FIG. 3 is adapted particularly to a solar cell. In FIG. 3, the reference numerals 5 and 6 designate active layers; 7, a surface protection and reflection resistant film; 8-1 to 8-3, regions in which PN junction layers are formed; 9, a rear surface electrode; and 10-1 and 10-2, electrodes. The other reference numerals are the same as in FIGS. 1A to 1C and FIG. 2.

In the photoelectric conversion device shown in FIG. 3, the semiconductor-device-producing substrate used in the device has low inner resistance as a whole because the granular crystals contained in the respective layers are fixed and electrically connected to one another at 6 to 12 connection points including connection points formed between upper and lower granular crystals contained in two layers respectively, connection points formed between adjacent granular crystals contained in one and the same layer, and connection points formed between the substrate and the granular crystals contained in the layer disposed on the substrate.

As the active layers 5, the surfaces of the silicon granular crystals and the surface of the substrate may be used directly or semiconductor layers (polycrystal, monocrystal or amorphous layers) of P type or N type silicon formed by a CVD method after heating may be used. The active layers 6 are different conduction type (N type or P type) silicon semiconductor layers formed on the active layers 5 respectively by a CVD method or a diffusion method. A PN junction surface is formed by the active layers 5 and 6. As the surface protection and reflection resistant film 7, a silicon dioxide film, a silicon nitride film, a phospho-silicate glass layer, or the like, is formed on the active layer 6 by thermal oxidation or by a CVD method, or the like, for the double purpose of protecting the surface of the active layer 6 and preventing reflection. The rear surface electrode 9 is attached to the rear surface of the semiconductor substrate 1. The electrode 10-1 is attached to the active layer 6 on the surface of granular crystals. The electrode 10-2 is attached to the active layer 6 on the front surface of the semiconductor substrate.

In the above description, a PN junction is formed by the active layers 5 and 6 on the surface of the semiconductor substrate and the surfaces of the granular crystals exposed to a space 8-1 surrounded by the uneven surface of the semiconductor substrate and adjacent granular crystals 2-1 contained in the first layer, and a surface protection and reflection resistant film 7 is further formed on the active layers 5 and 6. A PN junction is formed by the active layers 5 and 6 on the surfaces of granular crystals exposed to a space 8-2 surrounded by the granular crystals 2-1 and 2-2 contained in the first and second layers respectively, and a surface protection and reflection resistant film 7 is further formed on the active layers 5 and 6. A PN junction is formed by the active layers 5 and 6 on the surface of the semiconductor substrate and the surfaces of the granular crystals exposed to a space 8-3 surrounded by the uneven surface of the semiconductor substrate and granular crystals 2-1 contained in the first layer, and a surface protection and reflection resistant film 7 is further formed on the active layers 5 and 6.

Incidentally, FIG. 3 shows only the positions of the spaces 8-2 and 8-3 for simplification of the drawing. Three-dimensional spatial gaps formed by the surface of the semiconductor substrate and surfaces of granular crystals or by surfaces of granular crystals may be filled with a transparent matter (glass, plastics, or the like) as occasion demands.

The photoelectric conversion device according to the embodiment of the present invention shown in FIG. 3 can perform photoelectric conversion with very high efficiency because the photoelectric conversion device can be formed so that the effective PN junction area formed on the unit area of the substrate is increased to be in a range of from several times to ten and several times as explained above with reference to FIGS. 1A to 1C and FIG. 2. Accordingly, when the device is used as a solar cell, electric power can be taken out efficiently. When the device is used as a light-emitting diode, high-luminance light emission can be obtained.

Figure 4:
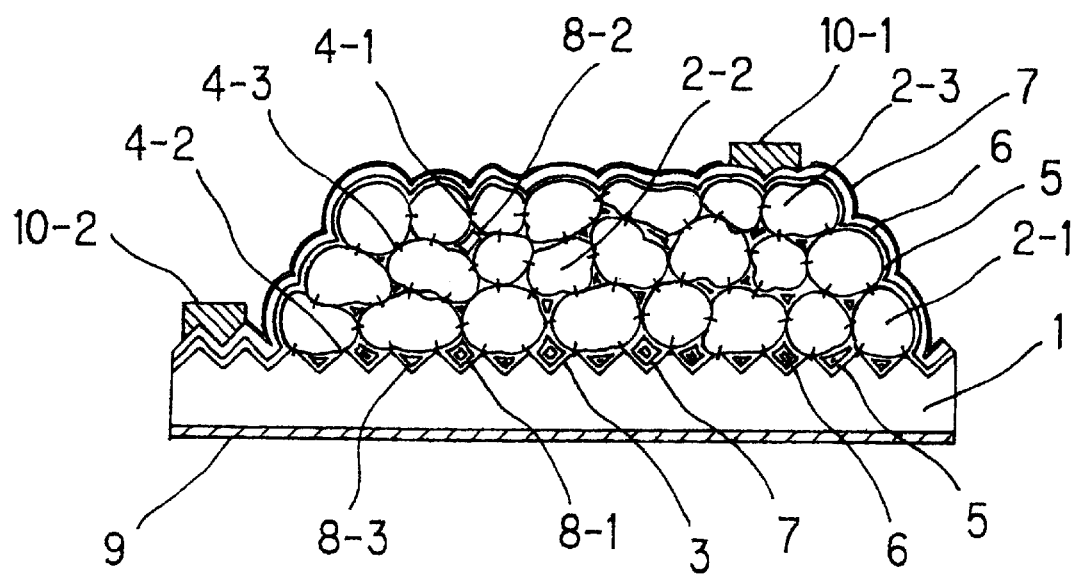
FIG. 4 is a view showing the sectional structure of a photoelectric conversion device according to another embodiment of the present invention, which is formed by use of a semiconductor-device-producing substrate comprising a semiconductor substrate and three semiconductor granular crystal layers.
Figure 5:
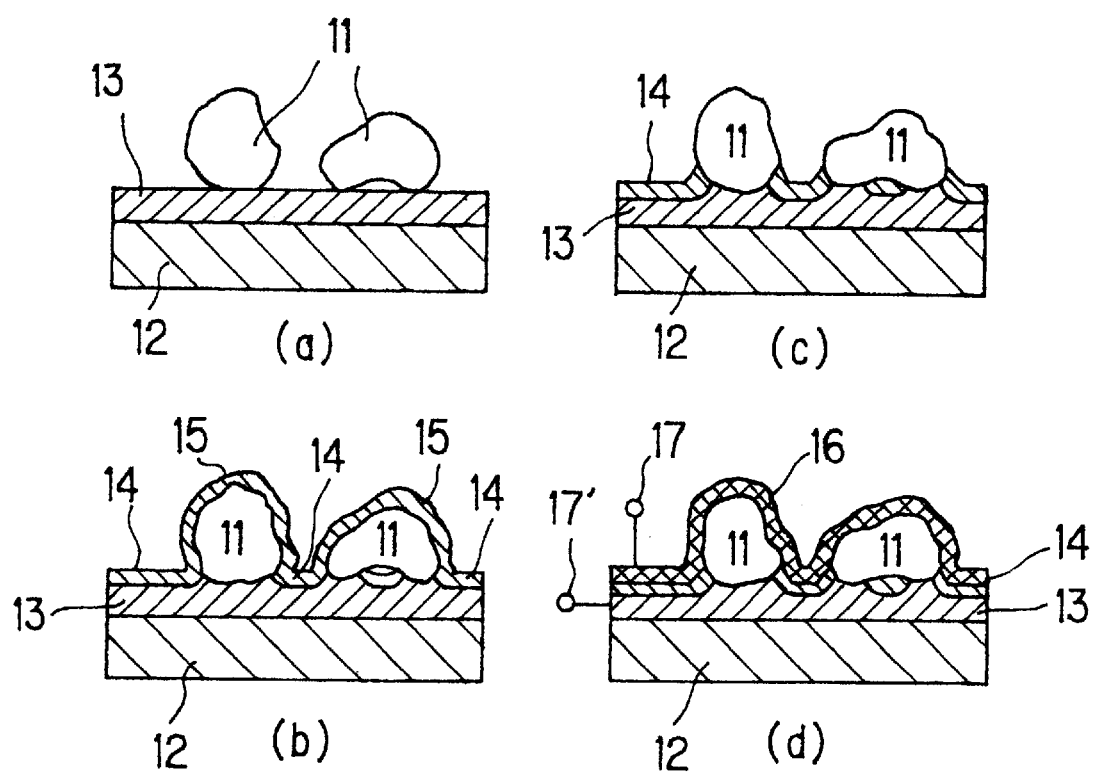
FIGS. 5A to 5D are views for explaining a related-art method for producing a photoelectric conversion device (solar cell).

FIG. 4 is a view showing the sectional structure of a photoelectric conversion device according to another embodiment of the present invention, which is produced by use of the aforementioned semiconductor-device-producing substrate composed of a semiconductor substrate and three semiconductor granular crystal layers. Reference numerals in FIG. 4 are the same as in FIG. 3.

In the case shown in FIG. 4, the shapes of semiconductor granular crystals 2-1 to 2-3 arranged on the surface of the semiconductor substrate are shown as the shapes similar to those used actually. Although the granular crystals are slightly deformed from the true-spherical granular crystals shown in FIGS. 1C and 2 in accordance with the producing method used, the basic performance and effect of the granular crystals do not change.

The configuration in the embodiment of the present invention shown in FIG. 4 is the same as in the embodiment explained above with reference to FIG. 3, except that semiconductor granular crystals are formed in the form of three layers in FIG. 4. The effective PN junction area formed on the unit area of the substrate becomes larger than that in FIG. 3. Accordingly, photoelectric conversion can be performed with higher efficiency, so that the embodiment shown in FIG. 4 is particularly suitable for a solar cell.

The silicon semiconductor substrate 1 used in the embodiment of the semiconductor-device-producing substrate according to the present invention or used in the embodiment of the photoelectric conversion device using the substrate, has P type or N type conduction characteristic and has specific resistance of from 0.005 $\Omega$·cm to 100 $\Omega$cm. A monocrystalline or polycrystalline material is used as the substrate material and uneven ness of from about 3 $\mu$m to 30 $\mu$m is formed on the front surface of the substrate material by lapping, grinding, and alkali-etching.

The semiconductor granular crystals have the same type (P type or N type) conduction characteristic as that of the substrate crystal. The semiconductor granular crystals are monocrystals or polycrystals having specific resistance of from 0.005 $\Omega$·cm to 100 $\Omega$·cm. As the granular crystals, granular crystals produced by solidification of fused liquid drops, by granulation of crystals, by a vapor phase method, or the like, are used and the surfaces of the granular crystals are finished by ball-milling or etching as occasion demands. The grain size of the granular crystals used is from 50 $\mu$m to 1 mm diameter.

The aforementioned semiconductor granular crystals are applied onto the whole limited region of the front surface of the semiconductor substrate crystal in the state as they are or in the state they are dispersed in pure water or in a high-purity organic solvent solution. The application of the granular crystals is performed by a mechanical method, an electrostatic method, a method using centrifugal force (spinner method), or the like.

The substrate having a plurality of granular crystal layers arranged thereon is pre-heated at a temperature of from 200° C. to 400° C. to vaporize water or organic solvent (liquid) so as to be dried. Then, the substrate is heated at a temperature of from 900° C. to 1200° C. for a time of from 1 hour to 3 hours in an atmosphere of a reducing or inert gas such as hydrogen, nitrogen, or the like. As a result, silicon atoms are rearranged so that the granular crystals and the semiconductor substrate are sintered and fixed to one another at connection points located between the grains of the granular crystals and at connection points located between the semiconductor substrate and the grains of the granular crystals contained in the first layer. As a result, the series electric resistance between the granular crystals and the semiconductor substrate is reduced. In the aforementioned manner, a semiconductor-device-producing substrate having a plurality of granular crystal layers can be obtained.

When a material having relatively high specific resistance (0.5 $\Omega$·cm to 5 $\Omega$·cm) is used for the granular crystals and the semiconductor substrate in the aforementioned semiconductor-device-producing substrate, the surface layer of the semiconductor-device-producing substrate can be used as one of active regions of the PN junction. However, when a material having low specific resistance (0.003 $\Omega$·cm to 0.5 $\Omega$·cm) is used for the granular crystals or the semiconductor substrate in order to reduce the inner series resistance thereof, the surface layer of the semiconductor-device-producing substrate cannot be used as one of active regions of the PN junction. In this case, if a high specific resistance layer 5 having specific resistance of from 0.5 $\Omega$·cm to 10 $\Omega$·cm (or higher) is deposited, by a CVD method (reduced pressure or ordinary pressure), on the semiconductor-device-producing substrate composed of a semiconductor substrate and granular crystals sintered and fixed by heating onto the substrate so that the layer 5 has a thickness of from 3 $\mu$m to 10 $\mu$m, the surface layer of the semiconductor-device-producing substrate can be used as one of active regions of the PN junction.

Although a physical method such as an ion implanting method, a sputtering method, or the like, is known as a method for forming an active layer, it is difficult to form a uniform active layer when such a physical method is used because the raw material is hardly revolved in the inside of the arrangement of the granular crystal layers.

In the respective embodiments of the present invention explained above, the connection area of each of the connection points between the granular crystals and between the granular crystals and the semiconductor substrate is enlarged (30 $\mu$m to 50 $\mu$m diameter) by a CVD method and the granular crystals are connected to one another at multi-points. Accordingly, the granular crystal layers can be firmly bonded to the semiconductor substrate. Further, fine unevenness and cracking are present in the surfaces of the granular crystals, so that the crystallinity is apt to be deteriorated. If the crystal layers are grown by a CVD method, however, the crystallinity in the surface of the granular crystals can be improved greatly.

Further, in the embodiments of the present invention described above, a low-resistance raw material can be used for the granular crystals and the semiconductor substrate. Accordingly, the inner series resistance of the semiconductor device can be reduced, so that the inner electric power loss can be reduced extremely. Further, in the embodiments of the present invention, not only semiconductor-grade high-purity silicon but also metal-grade metal silicon (specific resistance: 0.1 Ω·cm to 0.2 Ω·cm, P type) can be used as the semiconductor (silicon) material. Accordingly, the raw material can be secured easily, so that the cost in production of the semiconductor device can be reduced.

That is, the semiconductor-device-producing substrate according to the embodiments of the present invention explained above with reference to FIGS. 1A to 1C and FIG. 2, is a substrate crystal having a novel structure constituted by a low-specific-resistance granular crystal layer and a low-specific-resistance semiconductor substrate. The novel-structure substrate, as well as an epitaxial wafer having a P/P+ or N/N+ structure used in the related art for production of a transistor or an ultra LSI device, forms the base of a lot of semiconductor-device-producing substrates which will be described later.

Although the semiconductor-device-producing substrate according to the embodiments of the present invention has been described upon the case where a plurality of semiconductor granular crystal layers are arranged on a semiconductor substrate, the present invention may be applied also to the case where, after a plurality of semiconductor granular crystal layers are arranged on a substrate (for which any material may be used) and connected to one another in the aforementioned manner, only a portion of the granular crystals arranged as a plurality of layers is cut in the form of a flat plate or a block so as to be used in combination with the semiconductor substrate or to the case where a flat plate constituted only by granular crystals arranged as a plurality of layers is used as the semiconductor-device-producing substrate directly.

A method for producing a semiconductor device explained in FIGS. 3 and 4 by use of the aforementioned semiconductor-device-producing substrate will be described below.

First, a semiconductor active layer 5 having specific resistance of from 0.5 Ω·cm to 10 Ω·cm (or higher) and having a thickness of from 3 $\mu$m to 10 $\mu$m is formed on a surface of the aforementioned semiconductor-device-producing substrate by a CVD method (reduced pressure or ordinary pressure). Then, a different conduction type (N type or P type) semiconductor active layer 6 is formed on the semiconductor active layer 5 by a CVD method. The semiconductor active layer 6 has specific resistance of from 0.5 Ω·cm to 10 Ω·cm and has a thickness of from 1 $\mu$m to 10 $\mu$m. Alternatively, $POCl_3$, $PCl_3$ or $PH_3$ gas may be used as N type impurities and $B_2H_6/H_2$ gas or BN solid may be used as P type impurities, and those N and P type impurities are diffused by 1 $\mu$m to 3 $\mu$m into the semiconductor active layer 5 from its surface by a thermal diffusion method to thereby form the semiconductor active layer 6.

In the aforementioned manner, a PN junction surface is formed by the semiconductor active layers 5 and 6. If the concentration distribution of impurities to be added is changed when the aforementioned active layers are formed, the PN junction surface can be formed as a P-I-N (I is an intrinsic semiconductor region) or $P-N-N^{++}-P^{++}-P-N$ structure.

Then, a film 7 of silicon dioxide $SiO_2$, silicon nitride $Si_3N_4$, phospho silicate glass (PSG), or the like, is formed on the semiconductor active layer 6 by a CVD method for the double purpose of surface protection and reflection prevention. Spaces formed by the surfaces of the granular crystals and the surface of the substrate surrounded by the film 7 are filled with transparent glass or a transparent electrode material ITO (indium tin oxide), or the like.

Then, upper electrodes 10-1 and 10-2 are formed on the semiconductor active layer 6 by use of the steps of photo-lithographic etching, oxide film etching and aluminum vapor deposition (1 $\mu$m to 2 $\mu$m) in combination. Then, aluminum vapor deposition is applied to the rear surface of the semiconductor substrate to form a rear surface electrode 9. After the respective electrode portions are alloyed by heating, electrode attachment is terminated.

Although the embodiments of the present invention have been described upon the case where silicon is used for the active layers 5 and 6, the present invention may be applied also to the case where a hetero junction layer structure of GaAsP/GaAs/Si is formed as the active layer 5 from a material having direct transition characteristic, such as GaAsP, or the like, on the surfaces of silicon granular crystals and the surface of the semiconductor substrate by a CVD method and to the case where a different conduction type semiconductor layer of GaAsP is formed as the active layer 6 by a diffusion method or a CVD method. Further, Group II-Group VI (CdS, CdTe), calco-pyrite type semiconductor ($CuInSe_2$), etc. may be used as the semiconductor material.

An embodiment of the method for producing a photo-electric conversion device suitably used as a light-emitting diode using a compound semiconductor will be described below. Incidentally, the structure of the light-emitting diode may be the same as that explained in FIGS. 1A to 1C and FIGS. 2 to 4.

A light-emitting diode or a laser diode is used, as a light-emitting element, in optical communication, indication lamp, lighting, laser excitation light source, etc. Compound semiconductors having direct transition characteristic are popular as materials used for the light-emitting element. Two-component mixed crystals (GaAs, GaP, GaN), three-component mixed crystals (GaAsP, GaAlAs), four-component mixed crystals (InGaAsP, GaInNAs, AlGaInP), etc. are used so as to be classified by the wavelength band (several $\mu$m to 0.4 $\mu$m) of emitted light.

Although a liquid-phase growth method or a bulk crystal-diffusion method is known as a method for producing the element, a vapor-phase growth method (CVD) is mainly used. As a gas material, there is used a mixed gas of arsine $AsH_3$, phosphine $PH_3$, ammonia $NH_3$, trimethyl gallium $(CH)_3Ga$, triethyl indium $(C_2H_5)_3In$, trimethyl aluminum $(CH_3)_3Al$, etc. in the presence of $H_2$ gas as a carrier gas. The composition of a crystal is changed in accordance with the mixture proportion of the gas. As impurities added into the crystal layers, there are used N type impurities such as $H_2Te$ and $H_2S$ and P type impurities such as $Zn(CH_3)_2$. As the material for the crystal substrate, there is mainly used GaAs.

For production of the light-emitting element, both high-luminance light emission and large-area light emission are important but it is necessary to reduce the cost greatly because GaAs as the substrate crystal is expensive. Furthermore, because many materials used are harmful, it is necessary to reduce the quantities of the used materials in terms of safety.

The light-emitting element (light-emitting diode) emits light having a wavelength corresponding to coupling energy when a forward current is made to flow in the PN junction surface (by application of a voltage) so that electrons are re-coupled with holes. The light-receiving element (solar cell, photosensor) is excited by the energy of light radiated onto the PN junction surface so that generated electrons and holes generate an electric potential and a current. The light-receiving element has substantially the same structure as the light-emitting element.

Accordingly, in the embodiments of the present invention explained above with reference to FIGS. 1A to 1C and FIGS. 2 to 4, when GaAs is used as the semiconductor substrate 1 and the semiconductor granular crystals and the aforementioned compound semiconductors are used as the active layers 5 and 6 to form a PN junction layer, a photoelectric conversion device adapted to a light-emitting diode using compound semiconductors and having the same structure as that of a light-emitting diode using silicon can be produced.

Although the above description has been made upon the case where a photoelectric conversion device used as a light-emitting diode using compound semiconductors is produced inclusive of a semiconductor-device-producing substrate composed of a semiconductor substrate and granular crystals, not only the compound semiconductors are expensive as to the cost of the granular crystals and substrate crystal used but also substrate and granular crystals constituted by a multi-component (2-component to 4-component) composition are difficult to be produced and they are difficult to obtain. According to the present invention, a photoelectric conversion device used as a light-emitting diode using compound semiconductors can be produced by use of a semiconductor-device-producing substrate composed of silicon granular crystals and a silicon substrate explained as the embodiment of the photoelectric conversion device adapted to a solar cell with reference to FIGS. 1A to 1C and FIGS. 2 to 4. The method for producing the photoelectric conversion device will be described below.

In the same manner as explained with reference to FIGS. 1A to 1C, a semiconductor-device-producing substrate having granular crystals 2-1 to 2-3 sintered and fixed onto a silicon substrate 1 by heating is used directly or a semiconductor-device-producing substrate having granular crystals 2-1 to 2-3 . . . and having the silicon layer grown by CVD is used. First, an N type GaAs layer is grown on an N type silicon layer by use of an $AsH_3+Ga(CH_3)_3+H_2$ gas mixed with a dopant gas $H_2Te$ so that the thickness of the N type GaAs layer becomes in a range of from 3 μm to 10 μm. Then, an $Al(CH_3)_3$ gas is added to the $AsH_3+Ga(CH_3)_3+H_2$ gas so that an N type crystal active layer 5, for example, constituted by a three-component compound having a composition represented by $Ga_xAl_{1-x}As$, x=0.6 is grown to a thickness in a range of from 3 μm to 10 μm.

Then, a dopant gas $Zn(CH_3)_2$ is added so that a P type layer having the same composition $Ga_{0.6}Al_{0.4}As$ is grown to have a thickness of from 3 μm to 10 μm to thereby form an active layer 6. The P type active layer 6 may be formed by a thermal diffusion method (depth: 1 μm to 3 μm), by using $Zn_3As_2$, or the like, as a source, from the surface of the N type active layer 5. Then, a surface protection and reflection preventing film 7 of silicon nitride is formed on the surface of the active layer 6 by a CVD method. Further, an electrode 10-1 or 10-2 using Ti/Au or Au/Cr is formed on the surface of the P type active layer 6 by a sputtering method. An electrode 9 of an aluminum film is formed on the rear surface of the silicon substrate 1 by a sputtering method. The whole of the substrate is heated so that electrode attachment is terminated. Further, the substrate is cut by a dicing machine and etched to produce a photoelectric conversion device as occasion demands.

The photoelectric conversion device produced as described above is quite adapted to a light-emitting diode. That is, in the photoelectric conversion device, light emission occurs when a forward current is made to flow in the PN junction surface formed, and the emitted light is radiated in all directions without absorption to the inside of the active layers. The light is reflected by GaAs and Si layers in the bottom portion of the substrate used and is reflected by the surfaces of the granular crystals and substrate crystal. The reflected light passes through the active layers and spaces between the granular crystals and is radiated in the direction just above the granular crystal layers and various directions parallel with the just upward direction. The light can be radiated in one direction by use of an external reflection mirror surface as occasion demands.

In the photoelectric conversion device as a light-emitting diode having the aforementioned structure, light is radiated from a large-area region. While the reflection of the light is repeated, the quantity of light is accumulated so that the light having the accumulated light intensity is radiated from the surface (integrating effect). As described above, the ratio S.R. of the effective PN junction area to the unit area of the substrate is in a range of from several times to ten and several times. Accordingly, the intensity of radiated light in the aforementioned photoelectric conversion device as a light-emitting diode can be enhanced greatly.

That is, as described above, a high-luminance light-emitting diode having a large light-emitting area can be obtained. Furthermore, because Si is used as a basic material for forming the substrate, the material can be secured easily. Accordingly, extreme reduction in cost can be attained. Further, because the quantities of use of arsenic and phosphorus as causes of environmental pollution can be reduced, safety can be enhanced greatly.

The granular crystals and semiconductor substrate used in the embodiments of the present invention will be described below.

The granular crystals may be those which are made from silicon, germanium, gallium arsenide, etc. by a method for making crystalline nucleus flow in a silane-group gas, a crushing method, a fused-liquid-drop cooling method, or the like, or those which are obtained by applying silicon onto surfaces of grains of quartz glass, ceramics, alumina, etc. used as cores while, for example, the grains are made to flow in a silane-group gas. Further, the granular crystals include grains coated with silicon (monocrystal, polycrystal or amorphous layer) by a CVD method, etc., after the grains are fixed onto the substrate by heating, and further include grains in which a semiconductor hetero junction layer (SiGe/Si, GaAs/Si, InGaAs/GaAs/Si, etc.) forming an active layer of the PN junction is formed by a CVD method.

Examples of the semiconductor substrate include: a crystalline wafer cut out from a semiconductor crystalline ingot of silicon, germanium, gallium arsenide, etc.; an electrically insulating substrate of quartz glass, ceramics, alumina, plastics, a metal plate, glass, etc. coated with a metal thin film; an electrically insulating substrate coated with a semiconductor thin film (monocrystal, polycrystal or amorphous layer) of silicon, etc.; and a granular crystal layer plate obtained by sintering and molding granular crystals in the form of a flat plate. Further, like the granular crystals, the semiconductor substrate includes a substrate in which a semiconductor hetero junction layer (SiGe/Si, GaAs/Si, InGaAs/Si, etc.) forming an active layer of the PN junction is formed by a CVD method.

Further, the active layers 5 and 6 forming a PN junction surface in the embodiments of the present invention is produced by a CVD method. That is, Si/Si, SiGe/Si, GaAs/Si, GaP/Si, GaAsP/GaAs/Si, GaAlAs/GaAs/Si, GaAs/GaAs, AlGaInP/GaAs, GaInAsP/GaAs, GaInNAs/GaAs, etc. can be produced by same component growth or different component growth.

Although the embodiments of the present invention have been described upon the case where a semiconductor-device-producing substrate is formed and a solar cell or a light-emitting diode is formed on the substrate, the semiconductor-device-producing substrate according to the present invention can be widely applied to the production of other devices such as a high-sensitivity sensor, a large-capacity capacitor, etc.

The semiconductor-device-producing substrate of the above-mentioned embodiment according to the present invention has a structure in which semiconductor granular crystals or semiconductor-coated granular crystals are arranged in at least one layer on a semiconductor substrate or a semiconductor-coated substrate having a flat or uneven surface, and the granular crystals are connected and fixed to one another and to the substrate through semiconductor film by heating or by semiconductor film-bonding by a CVD method. Accordingly, it is possible to obtain the following effects.

That is, in the semiconductor-device-producing substrate according to the embodiments of the present invention, the granular crystals are stably fixed to one another and to the substrate at a large number of connection points by heating or by semiconductor film-bonding in accordance with a CVD method, so that the electrical inner series resistance of the substrate can be reduced. Accordingly, the crystal quality of the granular crystals and the substrate crystal can be enhanced (improved).

In the semiconductor-device-producing substrate according to the embodiments of the present invention, when silicon is used as the material for the semiconductor granular crystals and semiconductor substrate, not only Si on Si (substrate) but also a multilayer film such as Ge on Si, Si—Ge on Si, GaAs on Si, GaInAs on GaAs on Si, etc. can be produced, by a CVD method, inexpensively as a necessary semiconductor film structure on the substrate having the granular crystal layers provided thereon. Furthermore, safety against environmental pollution can be enhanced.

In the semiconductor-device-producing substrate according to the embodiments of the present invention, the effective PN junction area formed on the unit area of a flat substrate can be increased to be in a range of from several times to ten and several times or more.

Further, in the semiconductor-device-producing substrate according to the embodiments of the present invention, not only semiconductor-grade silicon but also metal-grade silicon can be used directly as the material for the substrate. Furthermore, the great reduction in cost can be attained on the basis of standardization.

In the photoelectric conversion device produced by use of the semiconductor-device-producing substrate according to the embodiments of the present invention, active layers having a PN junction surface are formed on the surface of the semiconductor-device-producing substrate by a CVD method or a diffusion method. A reaction is generated evenly in spaces in the inside of the granular layers so that a uniform PN junction layer can be obtained compared with other methods (such as an ion implanting method and a sputtering method). Accordingly, a semiconductor having a conduction type reverse to that of the surface layer of the granular crystals and substrate crystal can be formed easily, so that a mass-production effect can be obtained.

When the photoelectric conversion device is configured as a solar cell, a large-area PN junction surface and a large-area light-receiving surface can be obtained. An incident light containment effect is obtained on the basis of the three-dimensional structure of the light-receiving surface, so that solar energy can be grasped effectively. Accordingly, high photoelectric conversion efficiency can be obtained. Further, when the aforementioned semiconductor-device-producing substrate is used, not only the light-receiving element of silicon but also a light-receiving element (solar cell, photosensor, etc.) having a composition such as SiGe/Si (substrate), GaAs/Si, InGaAs/Si, etc. can be produced easily by a CVD method.

Further, when the photoelectric conversion device is configured as a light-emitting diode, a large-area PN junction surface and a large-area light-emitting surface can be obtained. Accordingly, a radiated light integrating effect occurs on the basis of the three-dimensional structure of the light-emitting surface, so that high-luminance light emission and high photoelectric conversion efficiency can be obtained. Further, when the semiconductor-device-producing substrate is used, a light-emitting diode using GaAs and a multilayer thin film of multi-component mixed crystals can be produced while the quantities of compound semiconductor materials used are reduced greatly to attain the reduction in cost and the improvement of safety against environmental pollution.

As described above, according to the present invention, it is possible to provide a semiconductor-device-producing substrate inexpensive and good in quality and having a large-area surface layer, and to provide a method for producing such a semiconductor-device-producing substrate. Further, by using such a semiconductor-device-producing substrate produced by the above-mentioned method, it is possible to provide a photoelectric conversion device such as a solar cell, a light emitting diode, or the like, in which high efficiency can be obtained on the basis of a light containment effect due to the large-area light-receiving surface and three-dimensional structure thereof, and to provide a method for producing such a photoelectric conversion device.

What is claimed is:

1. A semiconductor-device-producing substrate having a structure in which granular crystals selected from semiconductor granular crystals and semiconductor-coated granular crystals are arranged in a plurality of layers on a substrate selected from a semiconductor substrate and a semiconductor-coated substrate and having a flat or uneven surface whereby spaces are formed between said granular crystals and between said substrate and said granular crystals, said granular crystals being connected and fixed to one another and to said substrate through a semiconductor film.

2. A photoelectric conversion device in which active layers having a PN junction surface are formed on surfaces of a semiconductor substrate and granular crystals of a semiconductor-device-producing substrate defined in claim 1 wherein spaces are formed between the active layers on the respective surfaces of said semiconductor substrate and said granular crystals and between the active layers on the surfaces of said granular crystals.

3. A method for producing a semiconductor-device-producing substrate, comprising the steps of: arranging granular crystals selected from semiconductor granular crystals and semiconductor-coated granular crystals in a plurality of layers on a substrate selected from a semiconductor substrate and a semiconductor-coated substrate and having a flat or uneven surface so that spaces are formed between said granular crystals and between said substrate and said granular crystals; and connecting and fixing said granular crystals to one another and to said substrate through a semiconductor film by heating or semiconductor film-bonding by a CVD method.

* * * * *